United States Patent [19]

Cho et al.

[11] Patent Number: 5,036,272
[45] Date of Patent: Jul. 30, 1991

[54] PLURAL TEST MODE SELECTION CIRCUIT

[75] Inventors: Sung-Hee Cho; Jae-Young Do, both of Seoul; Jin-Ki Kim, Daegu, all of Rep. of Korea

[73] Assignee: SamSung Electronics Co., Ltd., Kyung Ki-Do, Rep. of Korea

[21] Appl. No.: 357,989

[22] Filed: May 30, 1989

[30] Foreign Application Priority Data

Dec. 14, 1988 [KR] Rep. of Korea ............... 1988-16648

[51] Int. Cl.$^5$ ............................................. G01R 15/12
[52] U.S. Cl. ............................ 324/158 R; 324/158 T; 371/22.1
[58] Field of Search ............... 324/158 R, 158 T, 73.1; 371/15.1, 22.1; 365/201

[56] References Cited

U.S. PATENT DOCUMENTS

| | | | |
|---|---|---|---|
| 4,336,495 | 6/1982 | Hapki | 324/158 T |
| 4,398,146 | 8/1983 | Draheim et al. | 324/158 T |
| 4,743,841 | 5/1988 | Takeuchi | 324/158 T |
| 4,752,729 | 6/1988 | Jackson et al. | 371/22.1 |
| 4,825,439 | 4/1989 | Sakashita et al. | 371/22.1 |
| 4,833,395 | 5/1989 | Sasaki et al. | 324/158 T |
| 4,841,233 | 6/1989 | Yoshida | 324/158 R |
| 4,866,714 | 9/1989 | Adams et al. | 371/22.1 |
| 4,910,735 | 3/1990 | Yamashita | 371/22.1 |

Primary Examiner—Kenneth A. Wieder
Assistant Examiner—William J. Burns
Attorney, Agent, or Firm—Robert E. Bushnell

[57] ABSTRACT

A plural test mode selection circuit in a semiconductor device capable of extending the number of option modes, e.g., up to 16 option modes by adding a high voltage sensing circuit 15 to any one of a plurality of input pads and by arranging a master decoder 25 and a slave decoder 20 each coupled to a plurality of buffer circuits 11-14, as well as a mode selector 30 and a plurality of address/control pads 5-9, and then an output of a high voltage sensing circuit 15 and respective outputs of the master decoder 25 and a slave decoder 20 are combined together at a mode selector 30, so that a plurality of test modes selection is possible therefrom. In addition, the invention also has an advantage capable of testing a chip even after it has been made into a package because of utilizing the address/control pad used in a general read/write operation.

12 Claims, 2 Drawing Sheets

PLURAL TEST MODE SELECTION CIRCUIT

BACKGROUND OF THE INVENTION

The present invention relates to a plural test mode selection circuit of a semiconductor device, particularly to a plural test mode selection circuit capable of extending a number of option modes by using a general address/control pad.

In general, a semiconductor device is manufactured so as to execute an operation of a particular mode in order to facilitate the evaluation of a chip in accordance with the tendency of increasing integration and reliability of the semiconductor product. That is to say, it is formed to operate by selecting any one of various option modes such as redundancy trimming, a die information adding function, an electrical characteristic evaluating function, and the like. It has been achieved either by using additionally a preparatory pad or by adding a high voltage sensing circuit to an address/control pad to select one option mode, used for evaluating the characteristics of a semiconductor chip, other than a general READ/WRITE operating mode of a semiconductor device.

In the above description, according to the former method, a preparatory pad which is to usually used is provided, and a particular mode can be selected by applying a power source to the preparatory pad in a wafer state. Thus, there are required as many preparatory pads as the number of the option modes because of selecting only one particular mode by one of the preparatory pads. And, the latter method utilizing a high voltage sensing circuit is constructed so as to select a particular mode by connecting the high voltage sensing circuit and the address/control pad. That is to say, when a high voltage (12-14 volts) is applied to a pad coupled with the high voltage sensing circuit, the high voltage sensing circuit is enabled and the particular mode is selected thereto. Therefore, it has been constructed such that only one particular mode can be selected by a single pad and the high voltage sensing circuit attached thereto.

Therefore, since the former method of applying the preparatory pad generally requires as many preparatory pads as the number of option modes, the dimension of a chip becomes larger. Further, when it is made in a package, there has been a problem that any particular mode can not be selected because the preparatory pads can not be bonded to each other. Moreover, the latter method of adding a high voltage sensing circuit to an address/control pad has rendered a problem that is hard to extend the number of option modes because only one particular mode is selected by one pad and one high voltage sensing circuit.

Therefore, an object of the present invention is to provide a plural test mode selection circuit capable of selecting a particular option mode by applying a high-voltage power source, by adding a high voltage sensing circuit to a part of the address/control pads used in a general read/write operation, and by applying a control signal and an address signal of CMOS/TTL level to the address/control pad without the high voltage sensing circuit.

Another object of the present invention is to provide a plural test mode selection circuit capable of extending the number of option modes by combination of one high-voltage source and other input signals.

To achieve the objects as described above, the plural test mode selection circuit for use in a semiconductor integrated circuit having a plurality of test modes, includes:

first, second, third, fourth and fifth address/control pads for inputting each externally applied voltage;

first, second, third, fourth and fifth buffers each connected with the pads, for buffering the address/control signals from each pad;

slave decoder connected with the second and third buffer circuit for producing a sub-mode signal;

master decoder connected with the fourth and fifth buffer circuit, for producing a main-mode signal;

mode selector connected with the slave decoder and master decoder, for selecting a particular mode; and high-voltage sensing circuit for enabling the mode selector only when a voltage applied from an exterior source reaches a particular voltage, whose input is connected to the first pad and output is connected to the mode selector.

BRIEF DESCRIPTION OF THE DRAWINGS

For a better understanding of the invention and to show how the same may be carried into effect, reference will now be made, by way of example, to the accompanying diagramatic drawings, in which.

DETAILED DESCRIPTION OF THE INVENTION

Hereinafter, the present invention will be described in detail with reference to the accompanying drawings.

Figure 1:
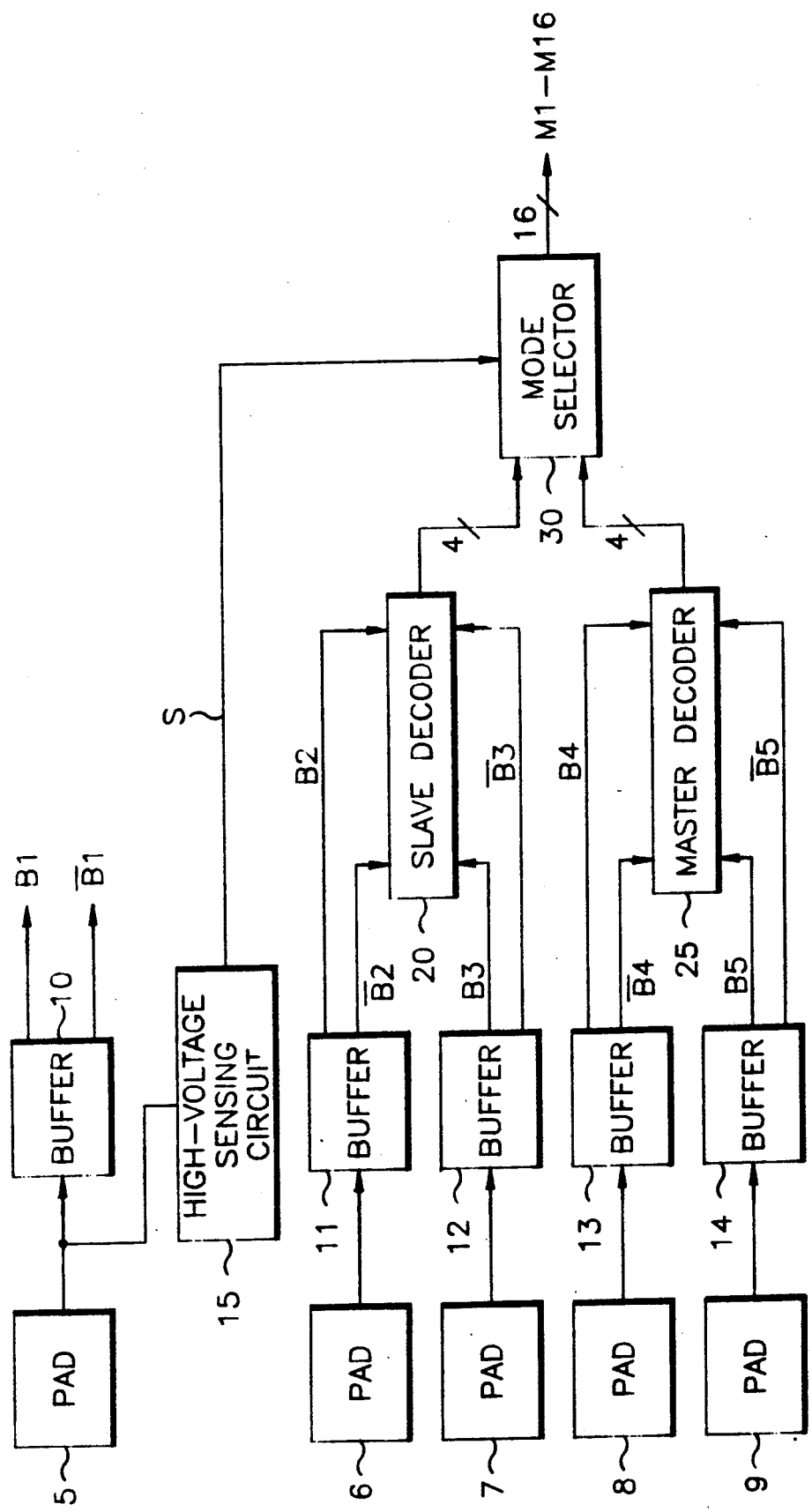
FIG. 1 is a block diagram of a plural test mode selection circuit according to the present invention.

FIG. 1 is a block diagram of a preferred embodiment of a plural test mode selection circuit according to the present invention. The plural test mode selection circuit includes: first, second, third, fourth and fifth address-/control pads 5-9 for receiving an externally applied voltage; first, second, third, fourth and fifth buffers 10-14 for buffering the address/control signals from each pad being connected with pads 5-9; a slave decoder 20 connected with the second and third buffer circuits 11, 12, for producing a sub-mode signal; a master decoder 25 connected with the fourth and fifth buffer circuit 13 and 14, for producing a main-mode signal; a a mode selector 30 connected with the slave decoder 20 and master decoder 25, for selecting a particular mode; and a high-voltage sensing circuit 15 for enabling the mode selector 30 only when a voltage applied from an exterior reaches a particular voltage, whose input is connected to the first pad 5 and output is connected to the mode selector 30.

The first, second, third, fourth and fifth buffer circuits 10-14 each receives the control and address signals of TTL/CMOS level through the first, second, third, fourth, fifth pads 5-9, respectively, and then produce the buffer signals B1, B2, B3, B4, B5, and their inverted signals $\overline{B1}, \overline{B2}, \overline{B3}, \overline{B4}\ \overline{B5}$ to thereby select an array of a chip or select a desired operation of a chip. And, the high-voltage sensing circuit 15 is described in an U.S. patent application No. 07/277,761 of the same applicant, filed 11/30/88, abandoned 2/20/90 for FWC 07/481,817 in which, when a control signal and an address signal through the first pad 5 are at a TTL/CMOS level, a high-voltage sensing output signal S is logic "low" state, while when the control signal and the address signal exceed 2 Vcc, the high-voltage sensing output signal S is changed to logic "high" state, making the mode selector 30 enable Vcc from a general source voltage supply that is conventional in the art.

Hereinafter, the operation of FIG. 1 will be described in detail. When a control signal and address signal of TTL/CMOS level is applied to of each pads 5-9, the first buffer circuit 10 is enabled and provides buffer output signals B1 and $\overline{B1}$ to thereby execute a general read/write operation of a chip, and the control signal and address signal of TTL/CMOS level applied through the second, third, fourth and fifth pads 6, 7, 8, 9 are buffered at the second, third, fourth and fifth buffer circuits 11, 12, 13, 14 to thereby produce the buffer output signals B2, B3, B4, B5 and their inverted outputs $\overline{B2}, \overline{B3}, \overline{B4}, \overline{B5}$. Among the buffer output signals B2, B3, B4, B5 and $\overline{B2}, \overline{B3}, \overline{B4}, \overline{B5}$, the buffer output signals B2, B3 and $\overline{B2}, \overline{B3}$ from the second and third buffer circuits 11, 12 are applied to the slave decoder 20, and the buffer output signals B4, B5 and $\overline{B4}, \overline{B5}$ from the fourth and fifth buffer circuits 13, 14 are applied to the master decoder 25, respectively. At that moment, four signals for sensing a main-mode from the master decoder 25 and four signals for selecting a sub-mode of the main-mode from slave decoder 20 are respectively produced to input to the mode selector 30. However, since a high voltage sensing output signal S of high voltage sensing circuit 15 is "low" state, the mode selector 30 becomes a disable state so that a mode selecting operation becomes impossible to execute. But, when a high voltage over 2 Vcc is applied to a first pad 5 in order to select a particular mode, an output signal S of the high voltage sensing circuit 15 is made to to become "high" state to thereby enable the mode selector 30. Further, the control signals and address signals of TTL/CMOS level through the second, third, fourth and fifth pads 6-9 are buffered at the second, third, fourth and fifth buffer circuits 11—to thereby output the output signals B2, B3, B4, B5 and $\overline{B2}, \overline{B3}, \overline{B4}, \overline{B5}$. At that moment, the buffer output signals B2, B3 and $\overline{B2}, \overline{B3}$ of said second and third buffer circuits 11, 12 are each applied to the slave decoder 20 to thereby produce four signals for selecting a sub-mode of a main-mode, and the buffer output signals B4, B5 and $\overline{B4}, \overline{B5}$ of fourth and fifth buffer circuits 13, 14 are each applied to the master decoder 25 to thereby produce four signals for selecting a main-mode. When the high voltage sensing output signal S, being in logic "high" state, of the high voltage sensing circuit 15 is applied to the mode selector 30, the mode selector is enabled. Thus both output signals from the master decoder 25 and slave decoder 20 are applied to the mode selector, and thereby a particular mode determined by a main-mode and a sub-mode thereof can be selected.

Figure 2:
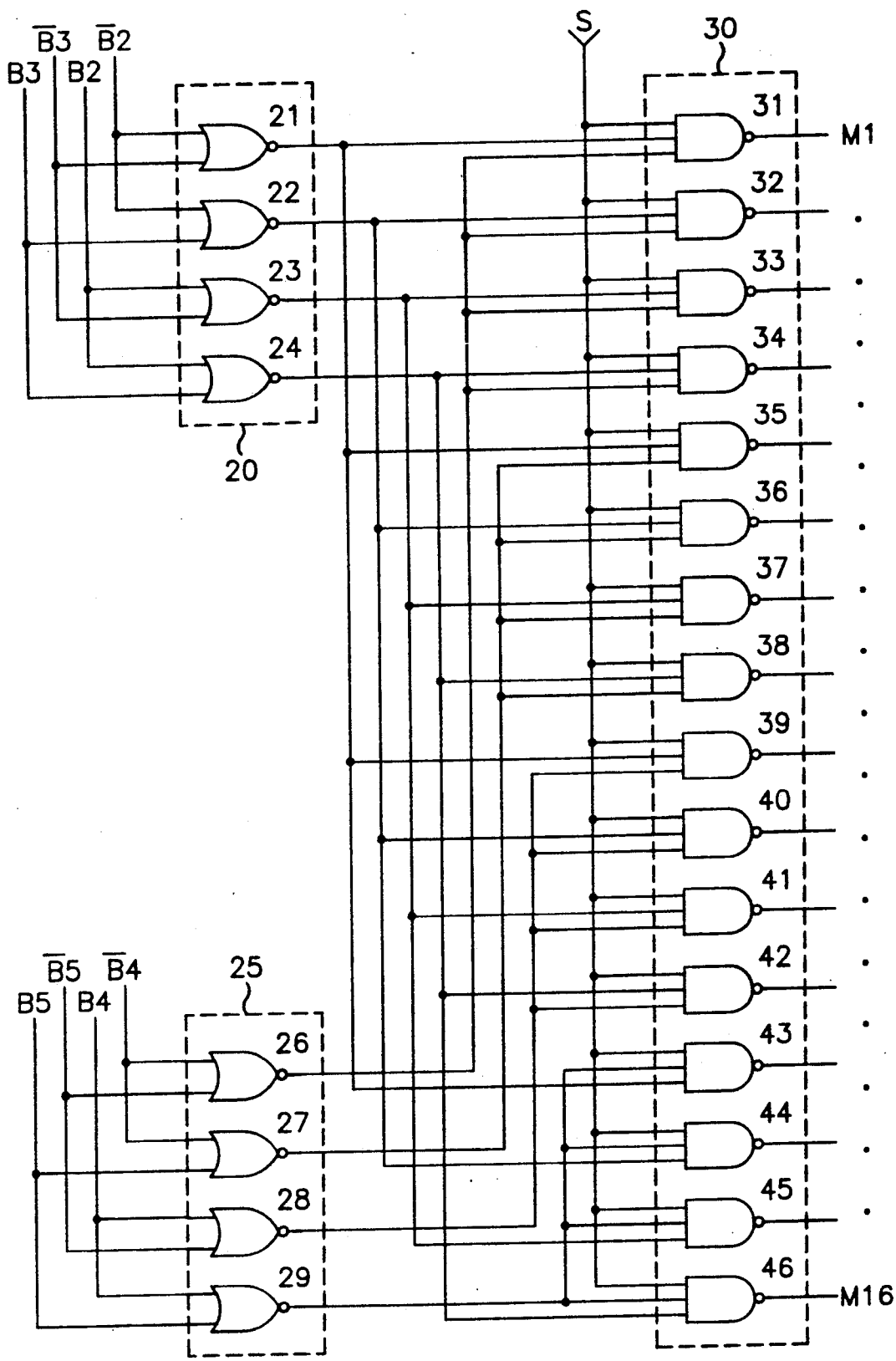
FIG. 2 is a circuit diagram showing a preferred embodiment of a master decoder, a slave decoder and a mode selector of FIG. 1.

FIG. 2 is a circuit diagram showing a preferred embodiment of a master decoder 25, a slave decoder 20 and a mode selector 30 in FIG. 1. The slave decoder 20 includes four NOR gates 21-24 and the master decoder 25 four NOR gates 26-29, and the mode selector 30 includes sixteen NAND gates 31 to 46 coupled by combination to said NOR gates 21 to 29. The buffer output signals B4, B5 and $\overline{B4}, \overline{B5}$ applied to each of fifth, sixth, seventh and eighth NOR gates 26, 27, 28, 29 of a master decoder 25 select a main-mode, and the buffer output signals B2, B3 and $\overline{B2}, \overline{B3}$ inputted to each of the first, second, third and fourth NOR gates 21, 22, 23, 24 of a slave decoder 20 select a sub-mode.

An example of an option mode selection will be explained with reference to the following table.

TABLE

| Master Decoder | | | Slave Decoder | | |
|---|---|---|---|---|---|
| B5 | B4 | main-mode | B3 | B2 | sub-mode |
| H | H | MODE I | H | H | TRIM 1 |
| L | H | MODE II | L | H | TRIM 2 |
| H | L | MODE III | H | L | TRIM 3 |
| L | L | MODE IV | L | L | TRIM 4 |

When the buffer output signals $\overline{B4}, \overline{B5}$ are respectively applied with logic "low" state to the master decoder 25, an output of fifth NOR gate 26 becomes "high" state. At this moment, since the outputs of the remaining NOR gates 27, 28, 29 become "low" state, the fifth NOR gate 26 is selected to thereby select a first main-mode (MODE I). The "high" signal from the fifth NOR gate 26 is applied to the first, second, third and fourth NAND gates 31, 32, 33, 34. Further, when the buffer output signals B2, B3 are respectively applied with "low" to the slave decoder 20, a "high" signal is provided by the first NOR gate 21. At this moment, since the outputs of the remaining NOR gates 22, 23, 24 go to a "low" state, the first NOR gate 21 is selected to thereby select the first sub-mode TRIM 1. A logic high output of the first NOR gate 21 is applied to first, fifth, ninth and thirteenth NAND gates 31, 35, 39 and 43, respectively. Therefore, two inputs by the first main-mode (MODE I) and the first sub-mode (TRIM 1) are "high" state, and another input of the first NAND gate 31 goes to a "high" state according to the high-voltage sensing output signal S of the high-voltage sensing circuit 15 of "high" state, so that the output of the first NAND gate 31 go to a "low" state. And the outputs of remaining NAND gates 32 to 46 become "high" state to thereby select a first option mode (M1) which is a first sub-mode (TRIM 1) of the first particular mode (MODE 1). Thus, the plural mode selecting circuit including four input signals and one high-voltage sensing output signal can select up to sixteen option modes by the combinations of the master decoder and the slave decoder.

Therefore, the present invention has an advantage capable of increasing greatly the number of option modes by adding a high-voltage sensing circuit to a part of address/control pads utilized in the general read/write operation. Furthermore, the invention also has an advantage capable of testing a chip even after it has been made in a package because of utilizing the address/control pad used in the general read/write operation.

While the invention has been particularly shown and described with reference to a preferred embodiment, it will be understood by those skilled in the art that modifications in detail may be made without departing from the spirit and scope of the invention.

What is claimed is:

1. A method of selecting a test mode from a plurality of options, comprising the steps of:
   buffering applied control and address signals to produce a plurality of normal and inverted output signals;
   producing a sub-mode signal by decoding a first set of selected said normal and inverted output signals using a first decoder;
   producing a main-mode signal a second and different set of selected said normal and inverted output signals using a second decoder;

enabling a selection from among a plurality of operational modes based on combinations of output signals received from said first and second decoders, in response to an enabling signal applied in lieu of one of said applied control and address signals; and choosing a mode based on the main-mode and sub-mode signals while enabling said selection.

2. In a semiconductor integrated circuit having a plurality of test modes, a plural test mode selection circuit comprising:
a sensing circuit disposed at any one of a plurality of input pads;
a plurality of buffer circuits, receiving respective first signals of TTL/CMOS level disposed at respective pads within a chip;
a plurality of means for decoding said first signals from corresponding ones of said plurality of buffer circuits;
means coupled to multiplicity of said plurality of decoding means and enabled by said high voltage sensing circuit, for selecting from a plurality of option modes based on combinations of output signals received from said multiplicity of said plurality of buffer circuit.

3. A plural test mode selection circuit according to claim 2, wherein a high-voltage delivered to the high-voltage sensing circuit of not more than 2 Vcc produces a second signal of ground potential and a high-voltage delivered to the high-voltage sensing circuit over 2 Vcc produces a second signal of power supply voltage potential, and Vcc is an usual source supply voltage used in semiconductor logic.

4. A plural test mode selection circuit according to claim 3, wherein the third signals generated by the plurality of buffers are combined by applying the third signals to a plurality of logic gating means comprising NAND gates and NOR gates.

5. A plural test mode selection circuit for use in a semiconductor integrated circuit having a plurality of test modes, comprising:
first, second, third, fourth, and fifth address/control pads for receiving a plurality of externally applied voltages;
first, second, third, fourth and fifth buffer means each connected with a respective pad, for buffering address/control signals received from each respective pad;
slave decoder means connected with said second and third buffer means, for producing a sub-mode signal;
master decoder means connected with said fourth and fifth buffer means, for producing a main-mode signal;
a mode selector connected with said slave decoder means and master decoder means, for selecting a particular mode based upon combinations of signals received from said slave and master decoder means; and
a sensing circuit, coupled between said first pad and mode selector, for enabling said mode selector only when a voltage applied from an exterior reaches a particular amplitude.

6. A plural test mode selection circuit for use in a semiconductor integrated circuit having a plurality of test modes, comprising:
a plurality of address/control pads for each receiving an externally applied voltage;
a plurality of buffer circuits, each connected with a respective pad, for buffering address/control signals from each of said pads;
a mode selector;
first decoder means coupled between a plurality of respective buffer circuits and said mode selector, for producing a first signal;
second decoder means coupled between a plurality of respective buffer circuits and said mode selector, for producing a second signal; and
a sensing circuit for enabling said mode selector upon an exterior voltage reaching a particular value;
wherein said mode selector is coupled to select from a plurality of option modes based on combinations of signals received from said first and second decoder means.

7. A plural test mode selection circuit according to claim 6, wherein a high-voltage delivered to the high-voltage sensing circuit, from one of said plurality of buffer circuits, of not more than 2 Vcc produces a third signal of ground potential and a high-voltage delivered to the high-voltage sensing circuit greater than 2 Vcc produces a third signal of power supply voltage potential, and Vcc is an usual source supply voltage used in semiconductor logic.

8. A plural test mode selection circuit according to claim 6, wherein fourth signals generated by the plurality of buffer circuits are combined by applying the fourth signals to a plurality of logic gating means, in said first decoder means, second decoder means and main selector, comprising NAND gates and NOR gates.

9. A plural test mode selection circuit according to claim 6, wherein said high-voltage sensing circuit is coupled between a first pad and said mode selector.

10. A plural test mode selection circuit according to claim 6, wherein said second decoder is coupled to second and third buffer circuits of said plurality of buffer circuits to produce said first signal.

11. A plural test mode selection circuit according to claim 6, wherein said second decoder means is coupled to fourth and fifth buffer circuits of said plurality of buffer circuits to produce said second signal.

12. A plural test mode selection circuit according to claim 6, wherein said mode selector is coupled to select from said plurality of option modes when enabled by said sensing circuit.

* * * * *

UNITED STATES PATENT AND TRADEMARK OFFICE
CERTIFICATE OF CORRECTION

PATENT NO. : 5,036,272

DATED : July 30, 1991

INVENTOR(S) : Sung-Hee CHO et al.

It is certified that error appears in the above-identified patent and that said Letters Patent is hereby corrected as shown below:

Column 1,    Line 26,    change "to" to --not--;

Column 2,    Line 47,    delete "a" (first occurrence);

Line 61,    change "an" to --a--;

Column 3,    Line 8,     change "of each" to --each of--;

Line 34,    delete "to" (first occurrence);

Line 39,    change "11-to" to --11 - 14--;

Column 4,    Line 35,    change "go" to --goes--.

Signed and Sealed this

Fifth Day of November, 1991

*Attest:*

HARRY F. MANBECK, JR.

*Attesting Officer*          *Commissioner of Patents and Trademarks*